United States Patent [19]

Nakamura

[11] Patent Number: 5,729,051
[45] Date of Patent: Mar. 17, 1998

[54] TAPE AUTOMATED BONDING TYPE SEMICONDUCTOR DEVICE

[75] Inventor: Tsuguo Nakamura, Tokyo, Japan

[73] Assignee: NEC Corporation, Tokyo, Japan

[21] Appl. No.: 532,117

[22] Filed: Sep. 22, 1995

[30] Foreign Application Priority Data

Sep. 22, 1994 [JP] Japan ................... 6-252739

[51] Int. Cl.$^6$ .................... H01L 23/495; H01L 23/48
[52] U.S. Cl. .................... 257/668; 257/697; 257/738; 257/780
[58] Field of Search .................... 257/668, 697, 257/737, 738, 778, 780

[56] References Cited

U.S. PATENT DOCUMENTS

| | | | |
|---|---|---|---|
| 4,413,308 | 11/1983 | Brown | 361/398 |
| 5,045,921 | 9/1991 | Lin et al. | 357/74 |
| 5,216,278 | 6/1993 | Lin et al. | 257/688 |
| 5,288,944 | 2/1994 | Bronson et al. | 257/697 |
| 5,293,072 | 3/1994 | Tsuji et al. | 257/697 |
| 5,334,857 | 8/1994 | Mennitt et al. | 257/737 |
| 5,409,865 | 4/1995 | Karnezos | 257/738 |
| 5,420,460 | 5/1995 | Massingill | 257/693 |
| 5,506,756 | 4/1996 | Haley | 257/786 |

Primary Examiner—Tom Thomas
Assistant Examiner—David Ostrowski
Attorney, Agent, or Firm—Helfgott & Karas, P.C.

[57] ABSTRACT

A flexible resin substrate with a device hole at the center thereof is formed wiring leads with copper foil on the back side face. A tape carrier having such construction forms substrate of a package. The wiring leads are formed to extend from the back side face of the flexible resin substrate into a device hole. The extended portions of the wiring leads are stepped within the device hole to form the inner leads. On the other hand, the wiring leads have lands provided greater width than other portions at the portions located on the back side face of the flexible resin substrate. A semiconductor chip is formed with bump elements of Au or so forth, on the surface side face and oriented directing the surface where the bump electrodes are formed downwardly and arranged within the device hole. The bump electrodes are connected to the inner leads of the tape carrier by batch bonding. On the other hand, the lands are arranged in a form of grid array. Solder balls are fixed on respective lands to form bumps. Also, an insulative resin layer covers the back side face of the tape carrier except for the lands. A sealing resin (mold resin) is formed filling the device hole and completely covers the semiconductor chip and further covers in a uniform thickness to cover over all area of the flexible resin substrate except for the peripheral edge portion.

5 Claims, 3 Drawing Sheets

TAPE AUTOMATED BONDING TYPE SEMICONDUCTOR DEVICE

BACKGROUND OF THE INVENTION

1. Field of the Invention

The present invention relates to a semiconductor device of a BGA (Ball Grid Array) structure employing a tape carrier.

2. Description of the Related Art

In the recent years, function and performance of Office Automation equipment and personal equipment are progressively increasing. In such equipments, reduction of weight and down-sizing are promoted. Therefore, there is a strong demand for a semiconductor device to be assembled in these equipments to increase number of pins and to decrease chip size. Development for satisfying such demand has been actively progressed. For example, in case of a plastic QFP (Quad Flat Package) type semiconductor device, according to increasing of number of pins and decreasing of the chip size, lead pitch in installation of a printed circuit board is reduced from 0.65 mm to 0.5 mm. Furthermore, the semiconductor device having the lead pitch of 0.4 mm has been put into manufacturing.

However, when attempt is made to obtain a semiconductor devices with a large number of pins, in the order of 300 to 400 pins without causing increasing of the chip size of the semiconductor device, it becomes necessary to further narrow the lead pitch and lead width. For this purpose, it becomes inherent to certainly provide co-planarity (flatness of the lead) at higher precision and to enhance accuracy in formation of solder electrodes of the printed circuit board. However, in the current technology of manufacturing, it is difficult to stably and reliably mount the semiconductor device having the lead pitch of 0.3 mm in manufacturing base.

Therefore, in place of arranging of pins in a line along the peripheral edge at the peripheral portion of the package, such as the QFP type semiconductor device and so forth, package structure called PGA (Pin Grid Array), in which pins are arranged two-dimensionally on the package surface, and LGA (Land Grid Array), becomes to be used. Furthermore, recently, there has been proposed a package structure, in which solder balls are arranged at the side of the semiconductor device for connecting the electrodes of the printed circuit board and the electrodes of the semiconductor device so as not to use the pins and thus to improve mounting ability. The semiconductor device called BGA having such type of package structure has been known in U.S. Pat. No. 5,216,278.

FIG. 1 is a section showing the conventional BGA type semiconductor device. As shown in FIG. 1, a glass epoxy substrate 7 having wiring on both surface is employed as a substrate of a package. On the central portion of the glass epoxy substrate 7, a mounting member 10 is arranged. On the mounting member 10, a semiconductor chip 1 is arranged. On the peripheral edge of the glass epoxy substrate 7 except for the portion where the mounting member 10 is arranged, wiring leads 8 are formed. On the other hand, on the back surface of the glass epoxy substrate 7, lands (not shown) are formed in a form of a grid array. The wiring leads 8 on the upper surface of the substrate 7 and the lands on the back surface are connected via through holes 9 formed in the substrate 7. Bumps 5 constituted of the solder balls are formed on the lands. On the other hand, the electrode pads of the semiconductor chip 1 and the wiring leads 8 are connected by means of bonding wires 11 of Au thin wire or so forth. Also, by covering the upper surface of the glass epoxy substrate 7 by a seal resin 4, the wiring leads 8, the semiconductor chip 1, the bonding wires 11 and so forth are sealed and isolated from the external atmosphere.

In the BGA type semiconductor device constructed as set forth above, the external terminal are arranged on the plane, namely two dimensionally. Therefore, in comparison with the QPF type semiconductor device, in which the pins are arranged in-line, interval between the pins, namely the interval between the bumps can be made wider to reduce load in mounting, if the pins of the semiconductor device are increased.

However, in the foregoing BGA type semiconductor device, since the package substrate 7 is formed of glass epoxy, adhesion ability between the glass epoxy substrate 7 and the sealing resin 4 is low. For instance, in the moisture absorption test by a PCT (Pressure Cooker Test) after assembling of the semiconductor device, a problem is encountered in the tendency of permitting penetration of the moisture through the interface between the glass exopy substrate 7 and the sealing resin 8. Furthermore, glass epoxy substrate 7 per se, on which the semiconductor chip 1 is arranged, has a nature to permit penetration of the moisture through the end surface. Therefore, due to low moisture resistance, the range of application of such semiconductor device is quite limited.

Also, in the conventional BGA type semiconductor device, since a rigid substrate, such as glass epoxy, is used as the package substrate, it can achieve relative low productivity. Furthermore, since it is required to use the substrate having wiring on both side surfaces and the wiring patterns on both side surfaces have to be connected via through holes, production cost of the substrate becomes high.

On the other hand, when a ceramic substrate is employed as the package substrate in place of the glass epoxy, moisture resistance can be improved. However, since the ceramic substrate is expensive, application may be limited in the viewpoint of the cost.

SUMMARY OF THE INVENTION

It is a first object of the present invention to provide a tape carrier type semiconductor device which has high sealing ability of a sealing resin and thus has high moisture resistance.

A second object of the present invention is to provide a BGA type semiconductor device which can be produced at low production cost.

A third object of the invention is to provide a semiconductor device which has high reliability and can be stably mounted on a printed circuit board in mas-production.

A tape carrier type semiconductor device according to the present invention, comprises: a flexible resin substrate having a first surface and a second surface. The flexible resin substrate has a device hole at the center thereof. Wiring leads are formed on the second surface of the flexible resin substrate. The wiring leads have inner leads formed at the portion extended into the device hole and lands formed on the second surface of the flexible resin substrate. Said lands are arranged in a form of grid array form. A semiconductor chip has electrodes connected to the inner leads and is arranged within the device hole. Bumps are formed on the lands. Sealing resin covers at least a surface of the semiconductor chip where the electrodes are formed, and inner leads. Said sealing resin is deposited on a part of the first surface of the flexible resin substrate in a uniform thickness, and filling the device hole.

The semiconductor device may have an insulative resin layer covering the second surface of the flexible resin substrate except for the bumps.

Also, in the semiconductor device, the sealing resin may cover the overall surface of the semiconductor chip.

Furthermore, in the semiconductor device, the sealing resin may have a central projecting portion projecting beyond the insulative resin layer in the device hole. The surface of the central projecting portion lies between a plane where the tip ends of the bumps lie and the surface of the insulative resin layer.

Also, in the semiconductor device, the sealing resin may cover the flexible resin substrate from the first surface to the second surface across a side between the first and second surface at a plurality of portions of the peripheral edge portion of the flexible resin substrate.

In addition, in the Semiconductor device, the sealing resin may have corner projecting portions projecting from the insulative resin layer at the back side face of the flexible resin substrate. A plane, on which the surface of the corner projecting portions lie, lies between a plane, on which tip ends of the bumps lie and a surface of the insulative resin layer.

The semiconductor device according to the present invention can be fabricated by employing an inexpensive three layer and one metal type carrier tape, in which a copper foil is bonded on the flexible film employing a bond, as the package substrate. Also, process steps of through hole plating and so forth become unnecessary. Therefore, the shown embodiment of the tape carrier type BGA semiconductor device according to the present invention can be produced at low cost. Furthermore, since the shown embodiment can be produced by applying an already established production means as a TCP (Tape Carrier Package) technology, substantially as is, any particular investment is not required while quite high mas-productivity is achieved for permitting further reduction of the production cost.

Furthermore, in the shown embodiment, since the semiconductor chip is completely covered with the sealing region (mold resin), penetration of moisture can be completely prevented to remarkably improve moisture resistance.

Furthermore, since the sealing resin covers overall area except for the peripheral edge of the first surface of the flexible resin substrate, a rigidity of the seal resin is provided for the semiconductor device for reinforcement. Accordingly, the shown embodiment of the semiconductor device assures to have sufficient rigidity without employing any other reinforcement material to facilitate handling. Also, by the sealing resin, co-planarity of the bumps can be certainly maintained. This facilitates mounting of the semiconductor device on the printed circuit board.

When the sealing resin covering the first surface of the flexible resin substrate forms corner projecting portions projecting downwardly at the four corners or four edges of the flexible resin substrate, and/or a central projecting portion projecting downwardly from a device hole at the center portion of the flexible resin substrate, obliquity of the semiconductor device or the printed circuit board, which can be caused upon mounting of the semiconductor device onto the printed circuit board, can be prevented for avoiding excessive deformation of the bumps due to local concentration of the load. Thus, a predetermined distance between the electrodes on the printed circuit board and the lands can be maintained. Also, shorting between the electrodes can be successfully prevented. Therefore, such semiconductor device can be mounted on the printed circuit board with high reliability.

Furthermore, in the present invention, since the external terminals are arranged in a form of grid array, the internal between the external terminals can be widened or greater number of external terminals may be extracted. Therefore, mounting on the printed circuit board can be further facilitated.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter in detail with reference to the accompanying drawings, particularly to FIGS. 2 to 7. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
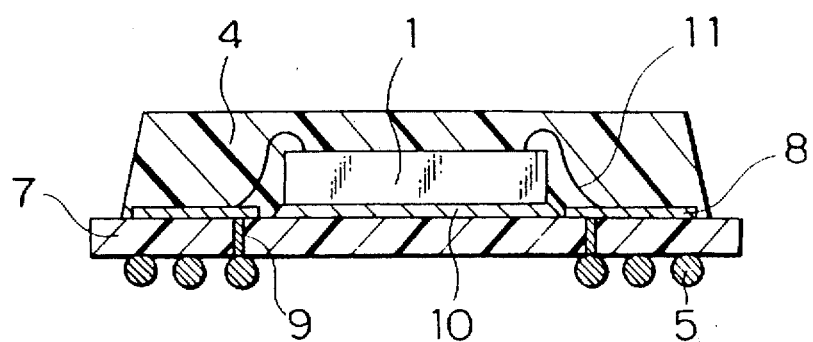
FIG. 1 is a section showing the conventional BGA type semiconductor device.
Figure 2:
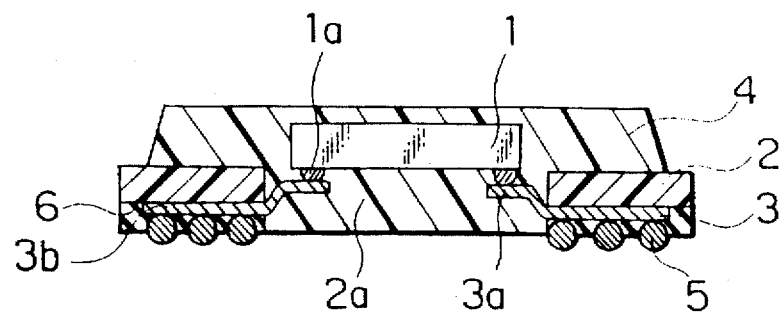
FIG. 2 is a section showing the first embodiment of a semiconductor device according to the present invention.
Figure 3:
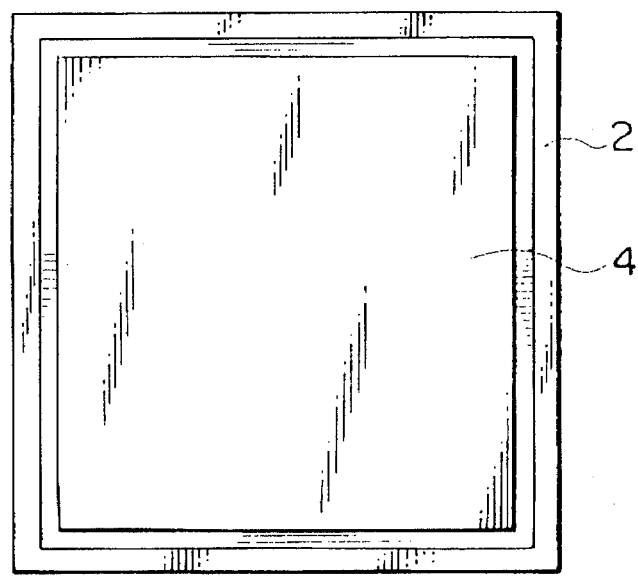
FIG. 3 is a plan view of the first embodiment of the semiconductor device of FIG. 2.
Figure 4:
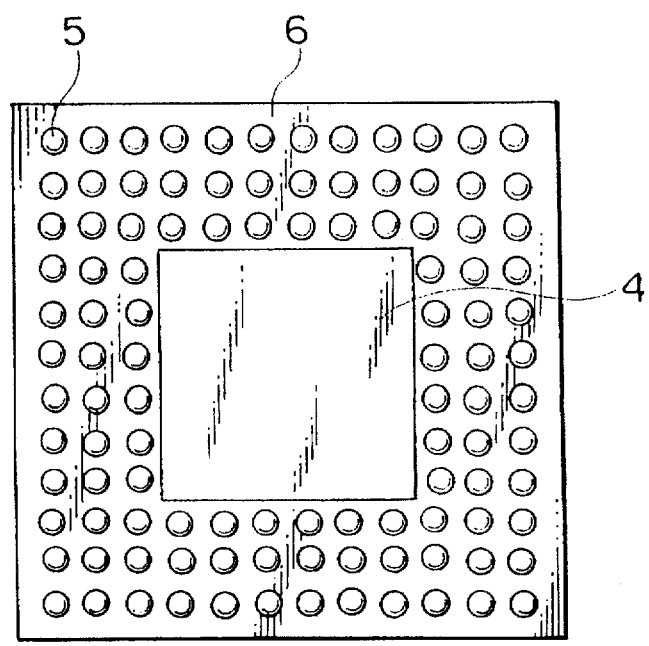
FIG. 4 is a bottom view of the first embodiment of the semiconductor device of FIG. 2.

FIG. 2 is a section showing the first embodiment of a semiconductor device according to the present invention, FIG. 3 is a plan view and FIG. 4 is a bottom view thereof.

At first, discussion will be Given for the internal structure of the semiconductor device. As shown in FIG. 2, a flexible resin substrate 2 formed from a polyimide film or so forth, is provide with a device hole 2a at the central portion thereof. On the back side surface (second surface) of the flexible resin substrate 2, wiring leads 3 of copper foils are formed. A tape carrier (flexible resin substrate 2 and the wiring leads 3) of the construction set forth above is used as a substrate of a package.

The wiring leads 3 are formed to extend from the back side surface of the flexible resin substrate 2 into the device hole 2a. The extended portions of the wiring leads 3 are stepped upwardly to form inner leads 3a. The outer ends and the intermediate portions of the wiring leads 3 mating the back side surface of the substrate 2 are formed with lands 3b having greater width than the remaining portions. On the lands 3b, solder balls are fixed to form bumps 5. A insulative resin layer 6 covers the back side surface (wiring lead forming surface) of the tape carrier except for the portions, on which the lands 3b are formed.

A semiconductor chip 1 is formed of bump electrodes 1a of Au or so forth on the surface. The semiconductor chip 1 is oriented to direct the surface where the bump electrodes 1a downwardly and arranged within the device hole 2a. The bump electrodes 1a of the semiconductor chip 1 are connected to the inner leads 3a of the tape carrier by way of batch bonding. Thus, the semiconductor chip 1 is supported on the inner leads 3a.

As shown in FIG. 4, while the insulative resin layer 6 covers the back side surface of the flexible resin substrate 2, the bumps 5 formed on the lands 3b are exposed from the insulative resin layer 6, in a form of grid array.

As shown in FIG. 3, a sealing resin 4 is deposited in a uniform thickness to cover overall area except for the peripheral portion on the upper surface (first surface) of the flexible resin substrate 2 for covering the semiconductor chip 1 disposed within the device hole 2a of the flexible resin substrate 2. Also, the sealing resin 4 fills up the device hole 2a and extends to the back side surface of the flexible resin substrate 2 in the height to lay on the common plane to the insulative resin layer 6. Therefore, the semiconductor chip 1 is completely covered by the sealing resin 4.

The shown embodiment of the tape carrier type BGA semiconductor device constructed as set forth above can be produced with employing an inexpensive three layer and one metal type tape carrier which is formed by bonding the copper foil on the flexible film by a bond, as the package substrate. Also, process steps of through hole plating and so forth become unnecessary. Therefore, the shown embodiment of the tape carrier type BGA semiconductor device according to the present invention can be produced at low cost. Furthermore, since the shown embodiment can be produced by applying an already established production means as a TCA (Tape carrier Package) technology, substantially as is, any particular investment is not required while quite high mas-productivity is achieved for permitting further reduction of the production cost.

Furthermore, in the shown embodiment, since the semiconductor chip 1 is completely covered with the sealing resin (mold resin) 4, different from the conventional BGA type semiconductor device, penetration of moisture can be completely prevented to remarkably improve moisture resistance.

Furthermore, since the sealing resin 4 covers overall area except for the peripheral edge of the upper surface of the flexible resin substrate 2, a rigidity of the seal resin 4 is provided for the semiconductor device for reinforcement. Accordingly, the shown embodiment of the semiconductor device assures to have sufficient rigidity without employing any other reinforcement material. Thus, it becomes possible to prevent deformation of the tape carrier with simple construction, and facilitates handling. Also, by the sealing resin, co-planarity of the bumps 5 can be certainly maintained. This facilitates mounting of the semiconductor device on the printed circuit board, and can be mounted together with other conventional surface mount type semiconductor devices, such as QFP type semiconductor devices or so forth.

On the other hand, in the semiconductor device of the shown embodiment, since the bumps 5 serving as external terminals are arranged in a form of the grid array, in comparison with the prior art case where the external terminals are arranged in a line along the peripheral edge on the peripheral portion of the package, the interval between the external terminal can be set much more Wider than the prior art case, if the member of the external terminals at the size of the package is same as the prior art case. For instance, assuming that the number of the external terminals (bumps 5) is 300 to 400, the pitch of the bumps 5 can be widened to be 1 to 1.5 mm. This makes mounting on the printed circuit board easier. On the other hand, by making the pitch of the external terminals and the package size the same, further greater number of external terminals can be extracted.

Next, the second embodiment of the semiconductor device according to the present invention will be discussed.

Figure 5:
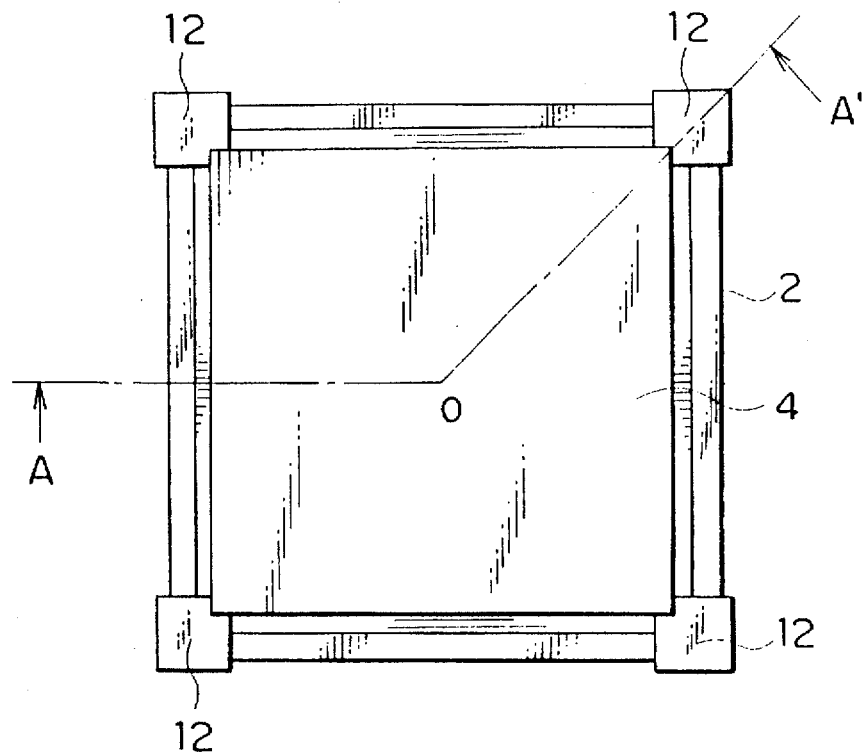
FIG. 5 is a plan view showing the second embodiment of a semiconductor device according to the present invention.
Figure 6:
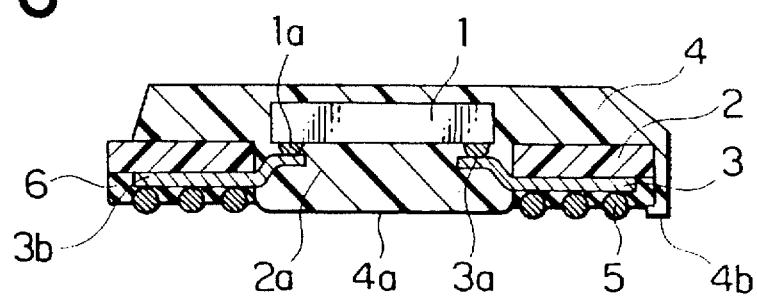
FIG. 6 is a section taken along a line AOA' in FIG. 5.

FIG. 5 is a plan view showing the second embodiment of the semiconductor device according to the present invention, and FIG. 6 is a section taken along line AOA' of FIG. 5. In FIGS. 5 and 6, like elements to those in FIGS. 2 to 4 will be represent like reference numerals and detailed description will be neglected for avoiding redundancy to keep the disclosure simple enough to facilitate clear understanding of the invention.

As shown in FIGS. 5 and 6, the shown embodiment is differentiated from the first embodiment as illustrated in FIG. 3, in that the sealing resin 4 is deposited in the uniform thickness to cover overall area except for the peripheral edge portion of the flexible resin substrate 2 for covering the semiconductor chip 1, and in addition to cover four corners 12 on the upper surface of the flexible resin substrate 2.

As shown in FIG. 6, the sealing resin 4 extends from the upper surface of the substrate 2 to the back side surface through the lateral side surface at each of the four corners 12 of the flexible resin substrate 2 and covers the edge portion of the wiring lead 3 forming surface. At the four corners, the sealing resin 4 is slightly projected over the surface of the insulative resin layer 6 to form corner projecting portions 4b. On the other hand, in the first embodiment shown in FIG. 2, the sealing resin 4 is filled in the device hole 2a to lay the lower surface on the common plane to the surface of the insulative resin layer 6 as set forth above. In contrast to this, in the shown embodiment, the surface of the sealing resin 4 exposed through the device hole 2a is slightly projected beyond the surface of the insulative resin layer 6 to form a central projecting portion 4a. The surface of the central projecting portion 4a is formed in flat. The flat surface of the central projecting portion 4a lays on the common plane to the corner projecting portions 4b. The common plane, on which the flat surface of the central projecting portion 4a and the corner projecting portions 4b lie, is positioned at the intermediate height position between the height position where the surface of the insulative resin layer lies and the height portion where the tip ends of the bumps 5 lie.

With the second embodiment constructed as set forth above, when the semiconductor device is mounted on the printed circuit board, even if the semiconductor device or the printed circuit board lies in oblique, local concentration of load to a part of bumps can be successfully prevented. Thus, occurrence of shorting or so forth due to excessive deformation of the bump can be reduced.

While the shown embodiment is formed with both of the central projecting portion 4a and the corner projecting portions 4b, both projections are not always necessary but either one of the projections may also work. On the other hand, in addition to the corner projecting portions 4b, or in place of the corner projecting portions 4b, in at least one of respective edge portions of the flexible resin substrate 2, the sealing resin 4 may be extended to the wiring lead forming surface to form the projection similar to the corner projecting portions 4b at the lower portion of the four edges.

Next, the third embodiment of the semiconductor device according to the present invention will be discussed.

Figure 7:
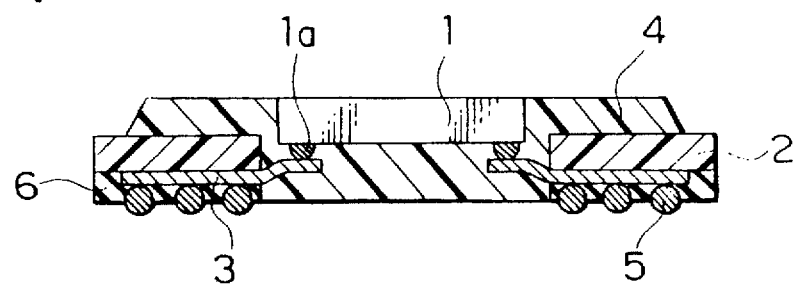
FIG. 7 is a section showing the third embodiment of a semiconductor device according to the present invention.

FIG. 7 is a section showing the third embodiment of the semiconductor device according to the present invention. Even in FIG. 7, the like elements to those in FIGS. 2 to 4 will be represented by like reference numerals and the detailed description thereof will be neglected.

As shown in FIG. 7, the shown embodiment is differentiated from the first embodiment shown in FIGS. 2 to 4 in that the back side surface (the surface where the electrode bumps 1a are not formed) of the semiconductor chip 1 is not covered by the sealing resin 4 but exposed externally.

With the third embodiment constructed as set forth above, since a heat radiation plate (not shown) or so forth can be directly contacted to the back side surface of the semiconductor chip 1, it is facilitated to prevent elevation of the thermal resistance even in the high performance semiconductor device which has large heat generation.

It should be noted that the shown embodiment has the semiconductor chip, back side surface of which is exposed, and thus is lower in moisture resistance in comparison with the first and second embodiments, in which the semiconductor chip 1 is completely isolated from external environment by the sealing resin 4. Accordingly, in case of the application required high moisture resistance, the first and second embodiment of the semiconductor device may be selectively used.

The present invention is not limited to the first to third embodiment as set forth above and various modifications are possible without departing from the principle of the invention. For instance, while the solder balls are employed as bumps in the shown embodiment, other material can be employed for forming the bumps. For example, copper balls and so forth coated by solder can be employed. Also, in place of the bumps formed on the surface of the semiconductor chip, an aluminum pad may be formed so that the inner leads of the tape carrier may be bonded thereto.

What is claimed is:

1. A tape carrier type semiconductor device comprising:
   a flexible resin substrate having a first surface and a second surface, said flexible resin substrate having a device hole at the center thereof;
   wiring leads formed on said second surface of said flexible resin substrate, said wiring leads having inner leads formed at the portion extended into said device hole and lands formed on said second surface of said flexible resin substrate, which lands are arranged in a form of a grid array;
   a semiconductor chip having electrodes connected to said inner leads and arranged within said device hole;
   bumps formed on said lands;
   sealing resin for covering at least a surface of said semiconductor chip where said electrodes are formed, and inner leads, said sealing resin being deposited on a part of said first surface of said flexible resin substrate in a uniform thickness and filling said device hole; and
   an insulative resin layer covering the second surface of said flexible resin substrate and partly covering said bumps such that said bumps project partially outwardly from said insulative resin layer but are held therein so as to prevent accidental short circuiting therebetween.

2. A semiconductor device as set forth in claim 1, wherein said sealing resin covers the overall surface of said semiconductor chip.

3. A semiconductor device as set forth in claim 1, wherein said sealing resin has a central projecting portion projecting beyond said insulative resin layer in said device hole, the surface of said central projecting portion lies between a plane where the tip ends of said bumps lie and the surface of said insulative resin layer.

4. A semiconductor device as set forth in claim 1, wherein said sealing resin covers said flexible resin substrate from the first surface to the second surface across a side surface between said first and second surface at a plurality of portions of the peripheral edge portion of said flexible resin substrate.

5. A semiconductor device as set forth in claim 4, wherein said sealing resin has corner projecting portions projecting from said insulative resin layer at the back side face of said flexible resin substrate, and a plane, on which the surface of said corner projecting portions lie, lies between a plane, on which tip ends of said bumps lie and a surface of said insulative resin layer.

* * * * *